US006778461B2

(12) United States Patent
Grasso

(10) Patent No.: US 6,778,461 B2
(45) Date of Patent: Aug. 17, 2004

(54) DYNAMIC RANDOM ACCESS MEMORY DEVICE EXTERNALLY FUNCTIONALLY EQUIVALENT TO A STATIC RANDOM ACCESS MEMORY

(75) Inventor: Giuseppe Grasso, San Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 180 days.

(21) Appl. No.: 10/124,494

(22) Filed: Apr. 17, 2002

(65) Prior Publication Data

US 2002/0163848 A1 Nov. 7, 2002

(30) Foreign Application Priority Data

Apr. 19, 2001 (EP) .............................................. 01830263

(51) Int. Cl.[7] .............................................. G11C 08/00
(52) U.S. Cl. .......................... 365/230.03; 365/230.03; 365/189.04
(58) Field of Search ............................ 365/230.01, 149, 365/230.02, 230.03, 185.08, 222, 238; 711/106

(56) References Cited

U.S. PATENT DOCUMENTS

| 4,758,993 A | | 7/1988 | Takemae ..................... 365/222 |
| 5,208,779 A | | 5/1993 | Walther et al. ............. 365/222 |
| 5,675,770 A | | 10/1997 | Ogata ..................... 395/497.04 |
| 5,805,524 A | | 9/1998 | Kotani et al. ............... 365/238 |
| 5,966,725 A | * | 10/1999 | Tabo .......................... 711/106 |
| 6,118,719 A | | 9/2000 | Dell et al. .................. 365/222 |

* cited by examiner

*Primary Examiner*—David Nelms
*Assistant Examiner*—Thinh T Nguyen
(74) *Attorney, Agent, or Firm*—Lisa K. Jorgenson; Allen, Dyer, Doppelt, Milbrath & Gilchrist, P.A.

(57) ABSTRACT

A random access memory (RAM) includes at least two memory banks. Each memory bank includes an array of dynamic random access memory (DRAM) cells, and self-refresh circuits for continuously submitting the DRAM cells to a refresh operation independent of the other memory banks. A first circuit selectively accesses one of the memory banks in response to an external access request. A second circuit suspends the refresh operation in the accessed memory bank while processing the external access request, and while the refresh operations in non-selected memory banks are not suspended.

38 Claims, 2 Drawing Sheets

DYNAMIC RANDOM ACCESS MEMORY DEVICE EXTERNALLY FUNCTIONALLY EQUIVALENT TO A STATIC RANDOM ACCESS MEMORY

FIELD OF THE INVENTION

The present invention relates to the field of semiconductor memories. More specifically, the invention relates to random access memory (RAM) devices, which are also known as volatile memory devices. Still more specifically, the invention relates to a dynamic random access memory device (DRAM) to be used as a static RAM (SRAM).

BACKGROUND OF THE INVENTION

Random access memories (RAMs) can be grouped in two broad categories: dynamic RAMs (DRAMs) and static RAMs (SRAMs). A DRAM is a memory device in which each memory cell comprises a small capacitor and a select transistor. The capacitor is used to store one of two prescribed values of electrical charges, representative of one bit of information, while the transistor is used to selectively allow access to the capacitor for reading or writing the stored information.

On the contrary, an SRAM is a memory device in which each memory cell comprises four or even six transistors and two resistors arranged to form a bistable circuit, i.e., a latch. The simpler structure of the DRAM memory cell as compared to the SRAM allows a very large array of memory cells to be integrated in a single semiconductor chip, and to achieve a larger storage capacity per unit chip area.

A drawback of DRAMs resides in the fact that since the information is stored in terms of an electrical charge of the memory cell capacitor, it is subjected to being lost, primarily due to the inevitable leakages of electrons across the semiconductor junctions. This makes it necessary to perform a periodic refresh operation of the information stored in each memory cell with a prescribed time period, so as to restore the prescribed electrical charge of the capacitor. SRAMs are not affected by this problem because of the latch structure of the memory cells thereof.

Several attempts have been made to make the DRAM refresh operation substantially transparent to the user. Several DRAM devices have also been proposed which do not require external signals to manage the refresh operation.

A common feature of the proposed DRAM devices is the provision of internal circuits adapted to generate the signals necessary to perform the refresh operation. These signals typically include the row address strobe (RAS) signal, the column address strobe (CAS) signal, the bit line pre-charge (PCH) signal and the sense (SEN) signal. In this way, the signals necessary to perform the refresh operation are not generated by a memory controller external to the memory device. Instead, they are generated by circuits internal to the memory device. DRAMs having this capability are therefore called self-refreshing. From the outside, a self-refreshing DRAM device can thus have the same number and kind of electrical terminals (pins) as an SRAM device of equal size.

The proposed self-refreshing DRAMs leave, however, the following problem unresolved. A feature of significant importance of an SRAM device is the certainty that the memory device provides a reply in a prescribed time to an external data request. In the proposed self-refreshing DRAMs the refresh procedure is hidden to the external user, but it is still performed internally to the memory device. It may thus happen that both the self-refreshing circuits internal to the memory device and the external user need to access a same memory word at the same time. The former for refreshing the information stored in the memory cells of the memory word, and the latter for reading or writing information from or to the memory word.

Additionally, due to the typical arrangement of the memory cells in a two-dimensional array, the above conflict occurs not only when the self-refreshing circuits and the external user need to access the very same memory word, but more generally when a simultaneous access to a same row of memory cells is required. A priority arbitration is thus necessary to establish which one of the two access requests has a higher priority. Normally, a higher priority is assigned to the external access request so that a suspension of the refresh operation becomes inevitable. If, as a consequence of repeated external access requests, the refresh operation is suspended too often, the data stored in some memory cells may get lost, since such memory cells are not refreshed within a prescribed time.

More recently, approaches have been proposed which implement write-back methods. According to these methods, the most recent accesses to the memory are performed on a back-up SRAM before being transferred to the array of DRAM memory cells. However, the internal architecture of the memory and the circuit complexity at least partially frustrate the advantage in terms of occupation of the chip area derived from using the small DRAM memory cell.

SUMMARY OF THE INVENTION

In view of the foregoing background, an object of the present invention is to provide a memory device functionally and structurally adapted to overcome the drawbacks of the prior art devices.

This and other objects, advantages and features according to the present invention are provided by a random access semiconductor memory comprising at least two memory banks, with each memory bank including a respective two-dimensional array of dynamic random access memory cells. Self-refresh circuits continuously submit the memory cells of the respective array to a refresh operation of data stored therein independently of the other memory bank.

The memory further includes first and second circuit means. The first circuit means are for selectively accessing one of the at least two memory banks in response to an external request of access to a memory location belonging to the memory bank. The second circuit means are for causing, in the accessed memory bank, a suspension of the refresh operation of the data stored in the memory cells of the respective array while serving the external request of access. The refresh operation is performed in the remaining memory bank.

Preferably, the first circuit means comprises a least significant bit of an external memory address, so that sequential access requests to contiguous memory locations in a memory address space causes sequential accesses to the memory banks. Advantageously, each of the memory banks comprises third circuit means for preventing the suspension of the refresh operation of the data stored in the memory cells of the respective array when a prescribed minimum period of the refresh operation is not respected. Preferably, the third circuit means causes the memory to generate an externally accessible alarm signal indicating that external access requests to the memory locations are suspended.

In one embodiment, the self-refresh circuits comprise a counter circuit for generating internal address signals for scanning the memory locations of the memory bank. The second circuit means comprise a count suspension circuit for suspending a count by the counter circuit.

The third circuit means may comprise a watch dog circuit operatively connected to the counter and re-triggered by the counter each time the counter circuit reaches a prescribed count value, for example, each time a counter overflow occurs. The watch dog circuit generates a memory bank alarm signal if two successive occurrences of the prescribed count, for example, two successive counter overflows, do not occur within a prescribed time with respect to the prescribed minimum period.

The watch dog circuit can comprise a re-triggerable monostable circuit. Preferably, the alarm signal is generated when at least one of the memory bank alarm signals is generated. The count suspension circuit can, for example, prevent a suspension of the count by the counter when the respective memory bank alarm signal is generated.

Advantageously, each memory bank comprises a row selection circuit for selecting a row of the respective two-dimensional array of memory cells according to a first group of bits of the external memory address, and a memory word selection circuit for selecting a memory word within the selected row according to a second group of bits of the external memory address. The first and second groups of bits are chosen to reduce or minimize a probability of successive accesses to the same memory bank in response to successive external access requests.

BRIEF DESCRIPTION OF THE DRAWINGS

The features and advantages of the present invention will appear from the following detailed description of one embodiment thereof, provided merely by way of a non-limiting example, illustrated in the annexed drawings, wherein.

DETAILED DESCRIPTION OF THE PREFERRED EMBODIMENTS

Figure 1:
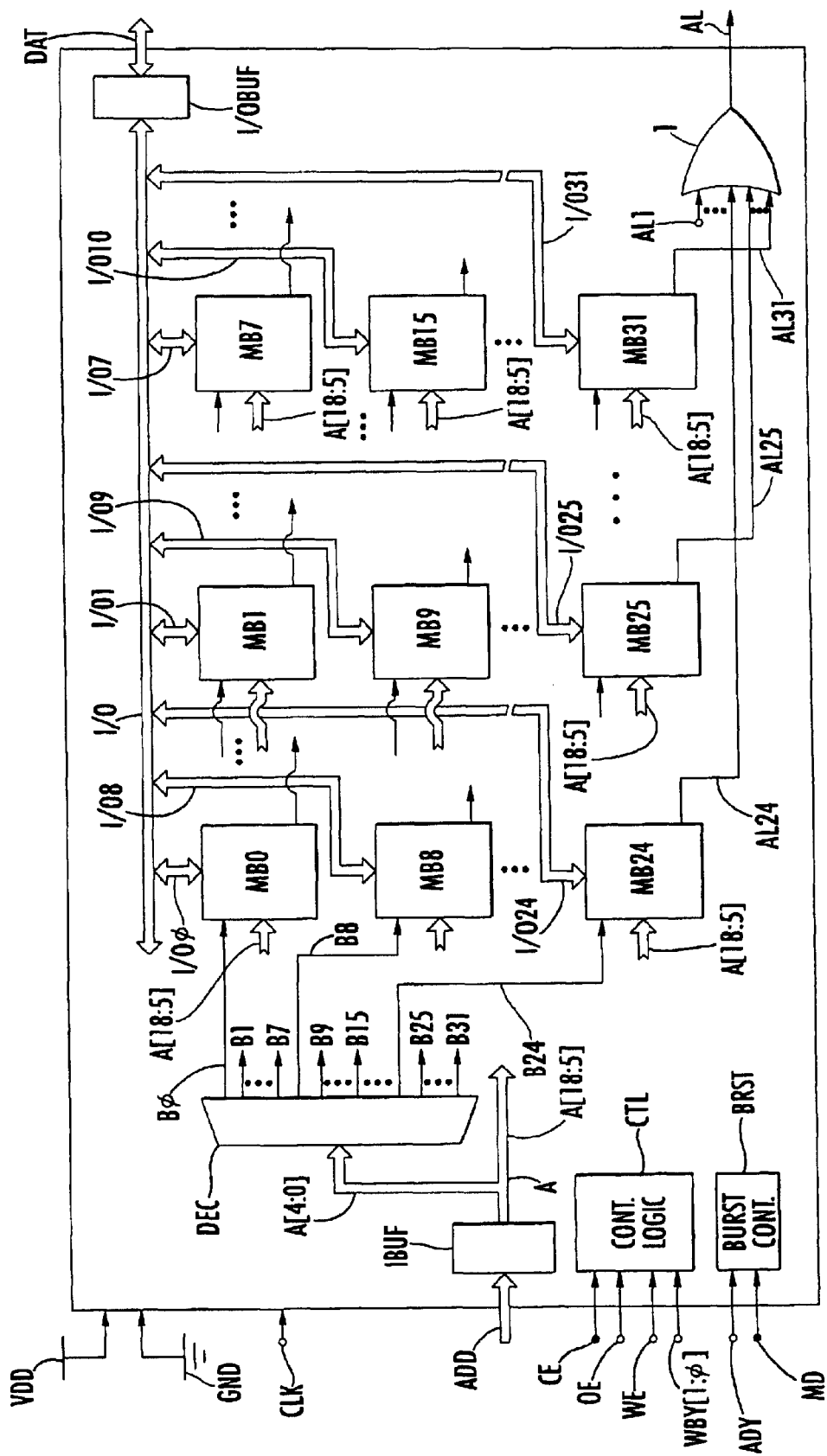
FIG. 1 is a schematic diagram of a memory device according to one embodiment of the present invention.

With reference to the drawings, and particularly to FIG. 1, one embodiment of a memory device according to the present invention is schematically shown. The memory device comprises a plurality of memory blocks or memory banks MB0–MB31. In the illustrated example, the plurality of memory banks MB0–MB31 includes thirty-two memory banks. However, the number of memory banks into which the illustrated memory is subdivided is not to be intended as a limitation of the present invention.

By way of example only, it is assumed that the memory is a 16 MB device with a parallel output of thirty-two bits. The memory device is thus arranged as 512 K memory words of thirty-two bits each. In this illustrated example, each one of the thirty-two memory banks MB0–MB31 has a storage capacity of 512 KB of information.

Each memory bank MB0–MB31 includes respective circuits for implementing a self-refresh operation independently of the other memory banks. Each memory bank has an input/output data bus I/O0–I/O31 which, in the example, includes thirty-two lines. All the input/output data buses I/O0–I/O31 are connected to an internal memory input/output data bus I/O having a same number of lines as the memory bank input/output data buses I/O0–I/O31. In the example, there are thirty-two lines. The internal memory input/output data bus I/O is coupled to an external data bus DAT through conventional input/output data buffer circuits I/OBUF.

The memory device receives address signals carried by an external address bus ADD. In this example, since 512 K memory words have to be addressed, the external address bus ADD includes nineteen address signal lines. Through conventional input buffer circuits IBUF the external address bus ADD is coupled to an internal memory address bus A.

A group of lines A[4:0] of the internal address bus A are supplied to a decoder circuit DEC. The decoder circuit DEC decodes a digital code carried by lines A[4:0] and correspondingly asserts one of a plurality of memory bank select signals B0–B31. Each one is associated with and is supplied to a respective memory bank MB0–MB31 for the selection thereof. Since in the present example there are thirty-two memory banks, thirty-two bank select signals B0–B31 are required. Therefore, the group of lines A[4:0] include five lines.

Advantageously, the group of lines A[4:0] of the internal address bus A which are supplied to the decoder circuit DEC for the selection of the memory banks MB0–MB31 corresponds to the least significant memory address bits. In this way, in case of a sequential access to memory locations identified by contiguous addresses (i.e., addresses differing from one another only in respect to one or more of the least significant bits thereof) a sequential selection of the memory banks MB0–MB31 will take place instead of a repeated selection of a same memory bank.

The remaining lines A[18:5] of the internal address bus A, which in this example includes fourteen lines, are commonly supplied to each of the memory banks MB0–MB31 for selectively addressing one memory word of thirty-two bits within each memory bank.

Each memory bank MB0–MB31 outputs a respective alarm signal AL0–AL31, which is asserted by the memory bank when a refresh operation on all the memory cells of the memory bank cannot be completed within a prescribed time. Each alarm signal is chosen to insure that the information stored in the memory cells are not lost. All the alarm signals AL0–AL31 are commonly supplied to a logic circuit, illustrated by a thirty-two input OR logic gate 1, an output of which is connected to an externally-accessible electrical terminal AL of the memory device.

The memory device is supplied with a voltage supply VDD and with a reference voltage GND, and in the shown example, with an external clock signal CLK used by the memory to synchronize the read and write operations, as well as other operations, such as the refresh operation to an external time base. The supply to the memory device of the external clock signal is not limited to the present invention. This is required only if a synchronous memory device is to be obtained.

No external clock signal is required in case the memory device has to be asynchronous. In this case, the internal memory timing can be determined by an internal clock signal. This clock signal is generated internal to the memory device using phase-locked loop (PLL) circuits or address transition detection (ATD) circuits, for example.

The memory device further comprises a control logic CTL receiving external control signals such as a chip enable signal CE for selecting the memory device, an output enable signal OE for enabling the memory device to output data read from the memory cells thereof onto the external data bus DAT, and a write enable signal WE for enabling an operation of data written into the memory device.

The control logic CTL can receive further external control signals WBY[1:0] for causing a selective write of a single data byte within an addressed memory word. In this example, since a memory word contains thirty-two bits, the external control signals WBY[1:0] include two signals, carrying a digital code adapted to select one byte among the four bytes making up a memory word.

A burst controller circuit block BRST can be provided in the memory device for allowing burst accesses to the memory in read or write modes, that is, automatic sequential accesses to memory words following a starting memory word. The request to perform a burst read or write is signaled to the memory device by a mode signal MD, and the burst controller circuit BRST receives an address Ady of the starting memory word. The burst controller circuit allows the read/write operations of streams of data starting from a single, externally supplied address to be speeded up.

Figure 2:
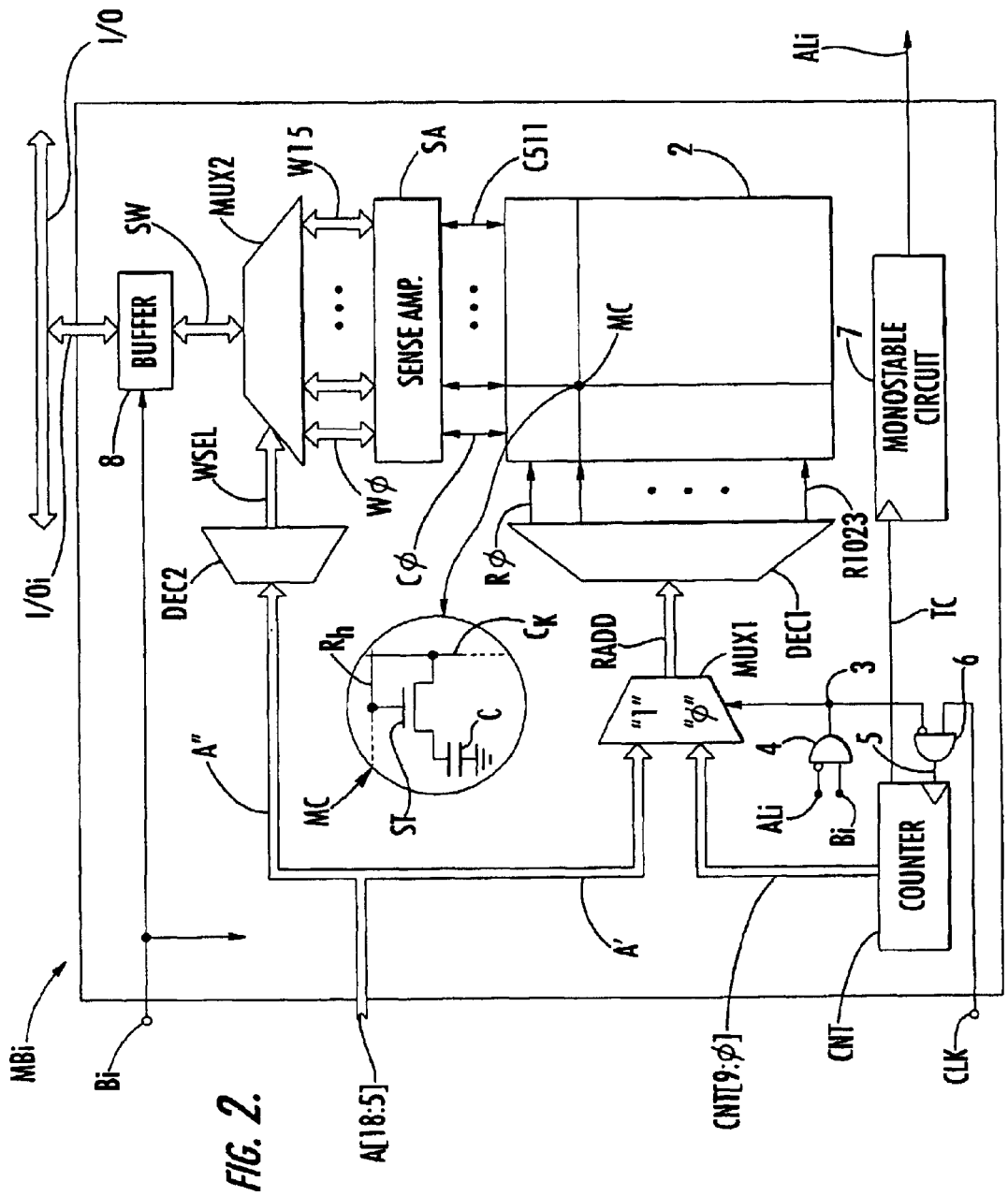
FIG. 2 is a schematic diagram of a memory bank of the memory device illustrated in FIG. 1.

FIG. 2 is a schematic diagram of the main components of a generic memory bank MBi of the plurality of memory banks MB0–MB31. The memory bank MBi comprises a two-dimensional array 2 of DRAM memory cells MC arranged by rows R0–R1023 and columns C0–C511. In the present example, the array 2 comprises 512 K memory cells MC arranged by 1024 rows and 512 columns.

Each memory cell MC is located at the intersection between a respective row and a respective column of the array 2. As shown in the enlarged detail portion of FIG. 2, each memory cell MC has the typical structure of a one-transistor DRAM memory cell, and comprises a charge storage capacitor C, for example, a thin-film capacitor, and a select transistor ST, for example, an N-channel MOSFET. The storage capacitor C has one plate connected to the reference voltage GND and the other plate connected to a source electrode of the select transistor ST. The latter has a drain electrode connected to the respective column Ck, and a gate electrode connected to the respective row Rh.

A row address decoder and a row selection circuit DEC1 receives row address signal lines RADD, and according to a digital code carried by the row address signal lines RADD, selects one row among the plurality of rows R0–R1023. The electrical potential of the selected row is, for example, brought to the supply voltage VDD, while all the non-selected rows are kept at the reference voltage GND. In this example, a ten-bit digital code is required to selectively address one row in the two-dimensional array 2, so that the row address signal lines include ten lines.

The row address signal lines RADD are provided by a two-input multiplexer MUX1. A first input of the multiplexer MUX1 receives a first group A' of lines from the lines A[18:5] of the internal address bus A. In this example the first group of lines A' includes ten lines, for example, lines A[14:5]. A second input of the multiplexer MUX1 receives output lines CNT[9:0] from a counter circuit CNT internal to the memory bank MBi.

In this example, the counter circuit CNT comprises a ten-bit counter and the counter output lines CNT[9:0] include ten lines carrying a digital code representative of a count value of the counter CNT to be used as an internally-generated address for addressing the rows of the array 2. The counter circuit thus acts as a scanning circuit for scanning the rows of the array 2.

The multiplexer MUX1 is controlled by a digital signal 3, which is an output of a circuit illustrated by a two-input AND logic gate 4. A first input of the AND gate 4 receives the memory bank select signal Bi, and a second input of the AND gate receives a logic complement of the memory bank alarm signal ALi. A logic 1 on signal 3 causes the multiplexer MUX1 to couple its output RADD to the first group A' of lines of the internal address bus A. A logic 0 on signal 3 causes the multiplexer MUX1 to couple its output RADD to the counter output lines CNT[9:0].

The counter circuit CNT is decremented each time a decrement signal 5 switches, for example, on a rising edge. The decrement signal 5 is generated by a logic circuit illustrated by a two-input AND gate 6. A first input of the AND gate 6 receives the external clock signal CLK, and a second input of the AND gate receives a logic complement of signal 3. If no external clock signal is provided, as in an asynchronous memory device, the AND gate 6 will be supplied with an internally generated clock signal.

Each time the counter circuit CNT reaches a prescribed count value, for example, each time the counter circuit overflows, a flag signal TC (terminal count) is asserted by the counter circuit CNT. The flag signal TC is supplied to a re-triggerable monostable circuit 7, an output of which forms the memory bank alarm signal ALi. As will described in greater below, the re-triggerable monostable circuit 7 has the function of a watch dog for the execution of the refresh operation on the memory cells MC of the array 2. Any circuit capable of performing such a function can thus be used in place of the monostable circuit 7.

The columns C0–C511 of the two-dimensional array 2 are connected to respective sense amplifier circuits illustrated by a circuit block SA. In the illustrated example, 512 sense amplifiers are provided, one for each column of the two-dimensional array 2.

Circuit block SA is also intended to include circuits to perform a refresh operation of the data stored in the memory cells MC of a row R0–R1023 selected by a digital code carried by the row address signal lines RADD. In particular, circuit block SA includes circuits to generate signals (CAS, PRC, SEN) for determining the timing of the pre-charge of the capacitances associated with the columns C0–C511, the equalization of the charge of the capacitances, the sensing of the memory cells MC of the selected row and the amplification of the sensed data. The circuits included in block SA are well known in the art, especially with respect to DRAMs and SRAMs, and will not be described in further detail.

The columns C0–C511 of the array 2 are arranged in groups of columns, with each group of columns containing a number of columns equal to the parallel memory output. In this example, the 512 columns C0–C511 are grouped in sixteen groups of thirty-two columns each. For example, the columns belonging to a same group are physically contiguous in the array 2.

The output of circuit block SA is represented by sixteen memory words W0–W15 of thirty-two bits each, which are supplied to a multiplexer MUX2 having sixteen inputs, each one thirty-two bits wide. The multiplexer MUX2 is controlled by signals WSEL for selecting one of the sixteen memory words W0–Wl5. Signals WSEL, which in this example are sixteen in number, are generated by a memory word address decoder and selection circuit DEC2 which is supplied by a second group A" of lines of the lines A[18:5] of the internal address bus A. In this example, the second group A" of lines includes four lines, for example, lines A[18:15]. Circuit DEC2 decodes a digital code carried by the group of lines A" and correspondingly asserts one of the lines WSEL.

An output SW of the multiplexer MUX2 represents the read data stored in the selected memory word, and is supplied to a three-state read/write buffer 8 controlled by the memory bank select signal Bi. The three-state read/write buffer 8 is connected to the memory input/output data bus I/O through the input/output data bus I/Oi of the memory bank MBi.

Operation of the memory will now be described. When an external device, for example, a microprocessor, needs to access the memory device either for reading or for writing data, the memory device select signal CE, and for a read access the output enable signal OE are asserted, and an address is supplied to the memory device through the external address bus ADD.

The decoder circuit DEC decodes a digital code carried by the group A[4:0] of the lines of the internal address bus A, and accordingly asserts one particular memory bank select signal Bi. In this way one particular memory bank MBi is selected.

The assertion of the memory bank select signal Bi causes the three-state read/write buffer 8 of the selected memory bank to connect the selected memory bank MBi to the internal memory input/output data bus I/O. On the contrary, the three-state read/write buffers 8 of the remaining, non-selected memory banks are kept in a high-impedance condition so that the non-selected memory banks are isolated from the input/output data bus I/O.

Referring back to the selected memory bank Bi and to FIG. 2, an assumption is made for the moment that the memory bank alarm signal ALi is not asserted (a logic 0), and the signal 3 follows the logic state of the memory bank select signal Bi. Thus, when the memory bank MBi is selected, the row address decoder and row selection circuit DEC1 is supplied with the first group A' of lines of the internal address bus A, which in turn corresponds to a group of lines of the external address bus ADD. The row to be selected is thus determined by an address externally supplied to the memory.

The circuits of circuit block SA perform the operation of pre-charging the columns, equalization, sensing and amplification of the sensed data, and supplies to the multiplexer MUX2 sixteen memory words W0–W15 of thirty-two bits each. The decoder circuit DEC2 decodes a digital code carried by the second group of lines A" of the internal address bus A and correspondingly asserts one of the sixteen signals WSEL. This causes the multiplexer MUX2 to transfer onto the output SW thereof one of the sixteen memory words W0–W15. The buffer 8 transfers the selected word to the internal memory input/output data bus I/O so that, through the input/output buffer circuits I/OBUF, the content of the accessed memory word is made available on the external data bus DAT.

Since the memory cells MC are DRAM cells, it is necessary to perform a continuous scanning of the rows to periodically refresh the data stored in the memory cells MC. The counter circuit CNT provided in each memory bank is normally decremented by one each time a prescribed transition front (for example, the rising front) is seen on signal 5.

When the memory bank is not selected the signal 5 follows the clock signal CLK so that at each rising edge of the clock signal CLK the counter CNT is decremented by one. In fact, when the memory bank is not selected the corresponding memory bank select signal Bi, which is not being asserted, is a logic 0, so that the signal 3 is a logic 0. The multiplexer MUX1 transfers the content CNT[9:0] of the counter circuit to the row address bus RADD, and the row to be selected is determined by the content of the counter circuit CNT. The self-refresh circuits of the block SA can thus perform the refresh operation of the memory cells MC of the selected row. Consequently, as long as a given memory bank is not selected by an externally-supplied address, the counter CNT sequentially scans the rows of the array 2 and the self-refresh circuits included in block SA periodically refresh the data stored in the memory cells MC of the array 2.

When a given memory bank MBi is selected as a consequence of an external request of read or write access to a memory word of the memory bank, and assuming that the respective memory bank alarm signal ALi is not asserted, the refresh operation of the memory cells of the bank is suspended. The signal 3, which in this case is a logic 1, masks the clock signal CLK and forces the signal 5 to a logic 0. The counter CNT is not decremented and maintains the address of the row in corresponding to the refresh operation that has been suspended. The refresh operation will restart from the row of the array 2 where it has been suspended as soon as the external access request has been satisfied and the memory bank is deselected.

For the memory cells MC not to loose the data stored therein, the refresh thereof must not be delayed too much. In other words, a prescribed minimum period of the refresh operation must be met to be sure that no memory cells loose the data stored therein. The refresh operation is suspended too frequently due to continuous access requests to a same memory bank, thus slowing down the scanning of the rows of the array 2. To avoid this, the watch dog monostable circuit 7 is provided.

The monostable circuit 7 measures the time lapsing between two terminal counts of the counter CNT. Each time the counter CNT overflows, the flag signal TC is set. The setting of the flag TC causes the monostable circuit 7 to start a new count down to a prescribed time duration. If the flag signal TC is not set within a prescribed time, the monostable circuit 7 can complete the count down. When the count down is completed, the monostable circuit 7 asserts (a logic 1 in the illustrated example) the memory bank alarm signal ALi.

The assertion of the memory bank alarm signal ALi performs two functions. A first function is to mask the memory bank selection signal Bi so that the refresh operation can be no longer be suspended even if an external request of access to the memory bank is received. A logic 1 on signal ALi forces the signal 3 to a logic 0, so that the counter circuit CNT continues to receive the clock signal CLK, and the multiplexer MUX1 transfers to the row address bus RADD the content CNT[9:0] of the counter CNT. A second function of the memory bank alarm signal ALi is to cause the memory alarm signal AL to be asserted. The memory alarm signal AL, which can for example be connected to a signal line connected in turn to an interrupt input of a microprocessor managing the memory device, signals to the microprocessor that any further access request to the memory must be suspended.

All the memory bank alarm signals AL0–AL31 are combined together in a logical OR, so that if even only one memory bank has not completed the refresh operation on the memory cells, that is, one scan of all the rows of the array has not been completed in the maximum allowed time, the microprocessor is signaled to suspend any further access to the memory.

For a ten-bit counter CNT as in the present example, assuming that the clock signal CLK has a frequency of 100 MHz (corresponding to a clock period TCLK of 10 ns), if no suspensions take place, the counter CNT will overflow every 10 µs. This time is clearly higher in case external access requests to memory words of the memory bank occur.

The choice of the time duration of the count down implemented by the monostable circuit 7 can be based on both technical and statistical reasons. Nowadays, the technology of DRAM manufacturing allows fabrication of DRAM memory cells with latency times higher than 32 ms, without the need of adopting expensive technical processes for assuring low losses. This means that a memory cell can keep the charge stored therein for up to 32 ms without the risk that the stored data will be lost.

A monostable circuit 7 implementing a count down of approximately 30 ms can thus be chosen. Since in the example the complete scan of the rows of the array takes approximately 10 µs in the best case if there are no external access requests to the memory bank. This means that a worst case of 3000 times the best case time is assumed. From a statistical viewpoint this seems to be a good trade off.

The detailed description of the present invention provided above is merely an example of one possible practical implementation. Clearly, neither the memory capacity nor the number of memory banks are to be intended as limited. In principle, the memory should include at least two memory banks, so that while an external request of access to a memory word of one bank is served the refresh procedure can go on in the other bank.

As a general rule, for a memory of a given size, the higher the number of memory banks in which the memory is subdivided the lower the probability that an alarm is generated. However, an increase in the number of memory banks will normally mean an increase in the chip area due to the necessity of replicating some circuits. It is to be observed that the increase in the chip area can be not substantial. Referring to the above example, 512 sense amplifiers are required for each of the thirty-two memory banks, for a total of 16 K sense amplifier circuits. The overall number of sense amplifier circuits does not change if sixty-four or even 128 memory banks are provided instead of thirty-two. The circuits to be replicated for a higher number of times are, for example, the counters and the monostable circuit.

The evaluation of the number of memory banks into which the memory device has to be subdivided shall be done on the basis of technical considerations relating to the chip area occupation, and on statistical considerations relating to the application context.

Additionally, even if in the example described the lines of the internal address bus A have been subdivided so that the lines A[18:15] corresponding to the four most significant address bits have been used to select the memory word, this is not to be intended as a limitation. Actually, the designer of the memory device should devise a subdivision of the address lines such that the probability that external access requests selecting a same memory bank is kept low.

This depends on the kind of application the memory is intended for, for example, for a microprogram running on the microprocessor. By analyzing the specific application of the memory device (general purpose, stream video, packet storage in networking applications, and so on) the memory designer can forecast the kind of accesses that the microprocessor will require to the memory device, and an access spectrum can be determined.

By applying the theory of probability to such an access spectrum, a law for assigning the memory addresses to the rows and columns of the memory banks can be determined. The assignment law is such as to substantially minimize the probability that successive access requests by the microprocessor cause the selection of a same memory bank. In this way, the probability that the refresh operation running on a given memory bank is suspended is minimized.

The memory device according to the present invention, without adopting the one-transistor memory cell structure of the DRAM devices, is externally and functionally equivalent to an SRAM device. In fact, unless the alarm signal is set, the execution of the refresh operation is completely transparent to the external user. The alarm signal is set only in exceptional situations, and as discussed above, the designer of the memory device can make the occurrence of such an exceptional situation extremely unlikely.

In particular, if the internal memory timing is governed by an external clock signal supplied to the memory device, the latter is externally and functionally equivalent to a synchronous SRAM, otherwise it is equivalent to an asynchronous SRAM. As a result of the present invention, it is thus possible to provide memory devices having a typical high storage capacity of a DRAM, that externally appears and operates as an SRAM. The present invention can apply to stand-alone memories and to embedded memories as well.

What is claimed is:

1. A random access memory (RAM) comprising:
   a plurality of memory banks, with each memory bank comprising
   an array of dynamic random access memory (DRAM) cells, and
   a self-refresh circuit connected to said array of DRAM cells for repeatedly submitting data stored therein to a refresh operation independent of the other memory banks;
   a first circuit for selectively accessing one of said plurality of memory banks in response to an external access request; and
   a second circuit for suspending the refresh operation of the accessed memory bank while processing the external access request, and while the refresh operations in non-selected memory banks are not suspended.

2. A RAM according to claim 1, wherein said first circuit comprises a first portion of an internal memory address bus providing a least significant bit from an external memory address bus so that sequential access requests to contiguous memory locations in a memory address causes sequential accesses to said plurality of memory banks.

3. A RAM according to claim 1, wherein each memory bank further comprises a third circuit for preventing suspension of the refresh operation when a minimum period of the refresh operation is not being performed.

4. A RAM according to claim 3, wherein said third circuit causes an externally accessible alarm signal to be generated indicating that the external access request has been suspended.

5. A RAM according to claim 4, wherein said self-refresh circuit for each respective memory bank comprises a counter for generating internal address signals for scanning memory locations of said respective memory bank; wherein said second circuit comprises a count suspension circuit for suspending a count by said counter; and wherein said third circuit comprises a watch dog circuit operatively connected to said counter and being re-triggered by said counter each time said counter reaches a predetermined count value.

6. A RAM according to claim 5, wherein the predetermined count value corresponds to each time a counter overflow occurs; and wherein said watch dog circuit generates a memory bank alarm signal if two successive occurrences of the predetermined count value do not occur within the minimum period of the refresh operation.

7. A RAM according to claim 6, wherein the two successive occurrences correspond to two successive counter overflows.

8. A RAM according to claim 5, wherein said watch dog circuit comprises a re-triggerable monostable circuit.

9. A RAM according to claim 6, wherein the externally accessible alarm signal is generated when any one of said memory banks generates the memory bank alarm signal.

10. A RAM according to claim 5, wherein said count suspension circuit within a respective memory bank prevents a suspension of the count by said counter when the memory bank alarm signal is generated by said respective memory bank.

11. A RAM according to claim 1, wherein each memory bank comprises:
a row selection circuit for selecting a row of said array of DRAM memory cells according to a first group of bits of an external memory address; and
a memory word selection circuit for selecting a memory word within the selected row according to a second group of bits of the external memory address;
the first and second groups of bits being chosen to minimize a probability of successive accesses to a same memory bank in response to successive external access requests.

12. A random access memory (RAM) comprising:
a plurality of memory banks, with each memory bank comprising
an array of dynamic random access memory (DRAM) cells, and
a self-refresh circuit connected to said array of DRAM cells for repeatedly submitting data stored therein to a refresh operation independent of the other memory banks;
first means for selectively accessing one of said plurality of memory banks in response to an external access request; and
second means for suspending the refresh operation of the accessed memory bank while processing the external access request, and while the refresh operations in non-selected memory banks are not suspended.

13. A RAM according to claim 12, wherein said first means circuit comprises a first portion of an internal memory address bus providing a least significant bit from an external memory address bus so that sequential access requests to contiguous memory locations in a memory address causes sequential accesses to said plurality of memory banks.

14. A RAM according to claim 12, wherein each memory bank further comprises third means for preventing suspension of the refresh operation when a minimum period of the refresh operation is not being performed.

15. A RAM according to claim 14, wherein said third means causes an externally accessible alarm signal to be generated indicating that the external access request has been suspended.

16. A RAM according to claim 15, wherein said self-refresh circuit for each respective memory bank comprises a counter for generating internal address signals for scanning memory locations of said respective memory bank; wherein said second means comprises a count suspension circuit for suspending a count by said counter; and wherein said third means comprises a watch dog circuit operatively connected to said counter and being re-triggered by said counter each time said counter reaches a predetermined count value.

17. A RAM according to claim 16, wherein the predetermined count value corresponds to each time a counter overflow occurs; and wherein said watch dog circuit generates a memory bank alarm signal if two successive occurrences of the predetermined count value do not occur within the minimum period of the refresh operation.

18. A RAM according to claim 17, wherein the externally accessible alarm signal is generated when any one of said memory banks generates the memory bank alarm signal.

19. A random access memory (RAM) comprising:
a plurality of memory banks, with each memory bank comprising
an array of dynamic random access memory (DRAM) cells, and
a self-refresh circuit connected to said array of DRAM cells for submitting data stored therein to a refresh operation independent of the other memory banks;
a first circuit for selectively accessing one of said plurality of memory banks in response to an external access request;
a second circuit for suspending the refresh operation of the accessed memory bank while processing the external access request, and while the refresh operations in non-selected memory banks are not suspended; and
a third circuit for preventing suspension of the refresh operation in the accessed memory bank when a minimum period of the refresh operation is not being performed.

20. A RAM according to claim 19, wherein said first circuit comprises a first portion of an internal memory address bus providing a least significant bit from an external memory address bus so that sequential access requests to contiguous memory locations in a memory address causes sequential accesses to said plurality of memory banks.

21. A RAM according to claim 19, wherein said third circuit causes an externally accessible alarm signal to be generated indicating that the external access request has been suspended.

22. A RAM according to claim 21, wherein said self-refresh circuit for each respective memory bank comprises a counter for generating internal address signals for scanning memory locations of said respective memory bank; wherein said second circuit comprises a count suspension circuit for suspending a count by said counter; and wherein said third circuit comprises a watch dog circuit operatively connected to said counter and being re-triggered by said counter each time said counter reaches a predetermined count value.

23. A RAM according to claim 22, wherein the predetermined count value corresponds to each time a counter overflow occurs; and wherein said watch dog circuit generates a memory bank alarm signal if two successive occurrences of the predetermined count value do not occur within the minimum period of the refresh operation.

24. A RAM according to claim 23, wherein the two successive occurrences correspond to two successive counter overflows.

25. A RAM according to claim 22, wherein said watch dog circuit comprises a re-triggerable monostable circuit.

26. A RAM according to claim 23, wherein the externally accessible alarm signal is generated when any one of said memory banks generates the memory bank alarm signal.

27. A RAM according to claim 23, wherein said count suspension circuit within a respective memory bank prevents a suspension of the count by said counter when the memory bank alarm signal is generated by said respective memory bank.

28. A RAM according to claim 19, wherein each memory bank comprises:

a row selection circuit for selecting a row of said array of DRAM memory cells according to a first group of bits of an external memory address; and a memory word selection circuit for selecting a memory word within the selected row according to a second group of bits of the external memory address, the first and second groups of bits being chosen to minimize a probability of successive accesses to a same memory bank in response to successive external access requests.

29. A method for using a dynamic random access memory (RAM) as a static RAM, the DRAM comprising a plurality of memory banks, with each memory bank comprising an array of DRAM cells, and a self-refresh circuit connected to the array of DRAM cells, the method comprising:

repeatedly submitting data stored in the DRAM cells of each memory bank to a refresh operation independent of the other memory banks;

selectively accessing one of the plurality of memory banks in response to an external access request; and suspending the refresh operation of the accessed memory bank while processing the external access request, and while the refresh operations in non-selected memory banks are not suspended.

30. A method according to claim 29, wherein selectively accessing one of the plurality of memory banks is performed using a first circuit comprising a first portion of an internal memory address bus providing a least significant bit from an external memory address bus so that sequential access requests to contiguous memory locations in a memory address causes sequential accesses to the plurality of memory banks.

31. A method according to claim 29, further comprising preventing suspension of the refresh operation when a minimum period of the refresh operation is not being performed.

32. A method according to claim 31, further comprising generating an externally accessible alarm signal indicating that the external access request has been suspended.

33. A method according to claim 32, wherein the self-refresh circuit for each respective memory bank comprises a counter for generating internal address signals for scanning memory locations of the respective memory bank; wherein selectively accessing is performed using a second circuit comprising a count suspension circuit for suspending a count by the counter; and wherein a watch dog circuit is operatively connected to the counter and being re-triggered by the counter each time the counter reaches a predetermined count value.

34. A method according to claim 33, wherein the predetermined count value corresponds to each time a counter overflow occurs; and wherein the watch dog circuit generates a memory bank alarm signal if two successive occurrences of the predetermined count value do not occur within the minimum period of the refresh operation.

35. A method according to claim 34, wherein the two successive occurrences correspond to two successive counter overflows.

36. A method according to claim 34, wherein the externally accessible alarm signal is generated when any one of the memory banks generates the memory bank alarm signal.

37. A method according to claim 33, wherein the count suspension circuit within a respective memory bank prevents a suspension of the count by the counter when the memory bank alarm signal is generated by said respective memory bank.

38. A method according to claim 29, further comprising for each memory bank:

selecting a row of the array of DRAM memory cells according to a first group of bits of an external memory address; and selecting a memory word within the selected row according to a second group of bits of the external memory address;

the first and second groups of bits being chosen to minimize a probability of successive accesses to a same memory bank in response to successive external access requests.

* * * * *